United States Patent [19]
Dhuey et al.

[11] Patent Number: 5,237,573
[45] Date of Patent: Aug. 17, 1993

[54] METHOD AND APPARATUS FOR SELECTIVELY SWITCHING BETWEEN INPUT SIGNALS

[75] Inventors: Michael J. Dhuey, Cupertino; Farid A. Yazdy, Belmont, both of Calif.

[73] Assignee: Apple Computer, Inc., Cupertino, Calif.

[21] Appl. No.: 860,950

[22] Filed: Mar. 31, 1992

[51] Int. Cl.⁵ ............................................. H04Q 11/04
[52] U.S. Cl. ............................ 370/112; 365/230.02; 340/825.03; 307/243; 307/445; 328/154
[58] Field of Search ............... 370/112; 365/189.02, 365/230.02; 340/825.03, 825.04; 307/243, 445; 328/152, 153, 154

[56] References Cited

U.S. PATENT DOCUMENTS

| | | | |
|---|---|---|---|
| 4,466,097 | 8/1984 | Nose | 370/112 |
| 4,486,880 | 12/1984 | Jeffery et al. | 370/112 |
| 4,754,456 | 6/1988 | Yato et al. | 370/112 |
| 4,891,808 | 1/1990 | Williams | 370/112 |
| 5,045,714 | 9/1991 | Park et al. | 307/243 |
| 5,109,360 | 4/1992 | Inazumi et al. | 365/230.02 X |
| 5,146,430 | 9/1992 | Torimaru et al. | 365/230.02 X |

*Primary Examiner*—Douglas W. Olms
*Assistant Examiner*—Russell W. Blum
*Attorney, Agent, or Firm*—Vernon R. Gard

[57] ABSTRACT

The present invention selectively switches between two or more input signals while avoiding invalid output conditions, large power draws, and the resulting electromagnetic interference caused thereby. The present invention can be used to select between Dynamic Random Access Memory device column addresses and Dynamic Random Access Memory device row addresses.

10 Claims, 2 Drawing Sheets

METHOD AND APPARATUS FOR SELECTIVELY SWITCHING BETWEEN INPUT SIGNALS

FIELD OF THE INVENTION

The present invention relates to the field of signal switching. More specifically, the present invention relates to the field of selectively switching between two or more input signals while avoiding invalid output conditions and the resulting electromagnetic interference caused thereby.

BACKGROUND OF THE INVENTION

A multiplexer (MUX) is a device used to transmit a multiplicity of signals to a single line. If there are several signal lines in a system and these signal lines are to be separately placed on a single line a MUX is a device which can, via a control signal, select which of the several signal lines is placed on the single line.

An example usage of MUX's is switching addresses to a Dynamic Random Access Memory (DRAM) device. Because DRAM's are generally arranged in a matrix, or array, configuration both row and column addresses are used to address a specific location within the DRAM array. However, it is common in the art to use the same signal lines for both row addresses and column addresses in order to reduce the total number of input/output pins connected to the DRAM device. What is common in the art is to multiplex the row and column addresses such that at one point in time the signal lines are used for row addresses and at another point in time the signal lines are used for column addresses.

It is thus important that the MUX used to select between the row addresses and the column addresses properly switch between them when so desired. An incorrect selection can, of course, result in an incorrect MUX output. Furthermore, when an incorrect MUX output is first made and then corrected shortly thereafter a voltage spike is created. Voltage spikes, in turn, create current spikes. Because ElectroMagnetic Interference (EMI) is directly related to the amount of current in electrical circuits, large current spikes create large amounts of EMI. It is undesirable to have excessive amounts of EMI because of governmental regulations which limit the amount of EMI allowable in electronic equipment. Therefore, not only do prior art MUXes temporarily provide incorrect outputs but they also cause undesirable EMI conditions.

SUMMARY AND OBJECTS OF THE INVENTION

An objective of the present invention is to provide an improved method for generating an output signal corresponding to either a first input signal or a second input signal according to a control signal.

A further objective of the present invention is to provide an improved apparatus for generating an output signal corresponding to either a first input signal or a second input signal according to a control signal.

The foregoing and other advantages are provided by a method for generating an output signal corresponding to either a first input signal or a second input signal according to a control signal, said output signal generation method comprising generating the logical AND of said first input signal and said control signal as a first intermediate signal, generating the logical AND of said second input signal and the inverse of said control signal as a second intermediate signal, generating the logical AND of said first input signal and said second input signal as a third intermediate signal, and generating the logical OR of said first intermediate signal, said second intermediate signal, and said third intermediate signal as said output signal.

The foregoing and other advantages are also provided by an apparatus for inputting a first input signal and a second input signal and outputting an output signal corresponding to either said first input signal or said second input signal according to a control signal, said apparatus comprising a means for generating the logical AND of said first input signal and said control signal as a first intermediate signal, a means for generating the logical AND of said second input signal and the inverse of said control signal as a second intermediate signal, a means for generating the logical AND of said first input signal and said second input signal as a third intermediate signal, and a means for generating the logical OR of said first intermediate signal, said second intermediate signal, and said third intermediate signal as said output signal of said apparatus.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
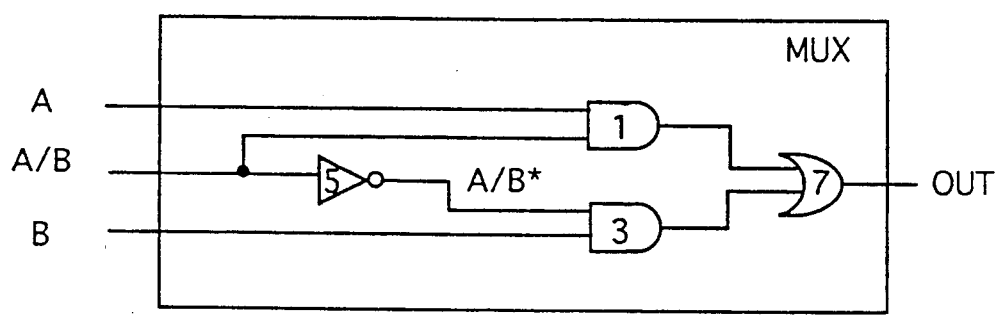
FIG. 1 is a logic diagram of a prior art multiplexer for switching addresses to DRAM arrays.

Referring now to FIG. 1, a logic diagram of a prior are MUX which can be used for switching addresses to DRAW arrays can be seen. Signal line A is a first input signal and signal line B is a second input signal to the prior art MUX while signal line A/B is the control signal to select between signal line A and signal line B. OUT is the output of the prior art MUX which is the selected input signal line.

The operation of the prior art MUX of FIG. 1 will now be explained. AND gate 1 receives signal line A as one input and control signal line A/B as another input. Therefore, consistent with the normal operation of an AND gate, when control signal A/B is high the output of AND gate 1 will correspond to the condition of signal line A: if signal line a is high, the output of AND gate 1 will correspondingly be low; and, if signal line A is high, the output of AND gate 1 will correspondingly be high. Similarly, AND gate 3 receives signal line B as a one input and control signal line A/B as another input except that control signal line A/B first passes through inverter 5. As such, when control signal line A/B is high, inverter 5 inverts the control signal so that AND gate 3 sees a low condition. Conversely, when control signal line A/B is low, inverter 5 inverts the control signal so that AND gate 3 sees a high condition. Therefore, consistent with the normal operation of an AND gate, when control signal A/B is low (due to inverter 5) the output of AND gate 3 will correspond to the condition of signal line B: if signal line B is low, the output of AND gate 3 will correspondingly be low; and, if signal line B is high, the output of AND gate 3 will correspondingly be high.

The output of AND gate 1 and the output of AND gate 3 are both input to OR gate 7. Therefore, consistent with the normal operation of an OR gate, if either AND gate 1 or AND gate 3 generates a high output condition OR gate 7 will output a high condition to the OUT signal line of the prior art MUX. As such, if control signal A/B is high the output of AND gate 1 will follow signal line A and if signal line A is high then OUT signal line will be high (and if signal line A is low then OUT signal line will be low). Similarly, if control signal A/B is low the output of AND gate 3 will follow signal line B and if signal line B is high then OUT signal line will be high (and if signal line B is low then OUT signal line will be low). Thus, as has now been explained, control signal line A/B of the prior art MUX "selects" as an output between the input signal lines A and B.

Unfortunately, the prior art MUX can incur timing problems which can cause logic faults. Furthermore, these logic faults can occur within a short span of time thus causing unwanted ElectroMagnetic Interference (EMI).

Figure 2:
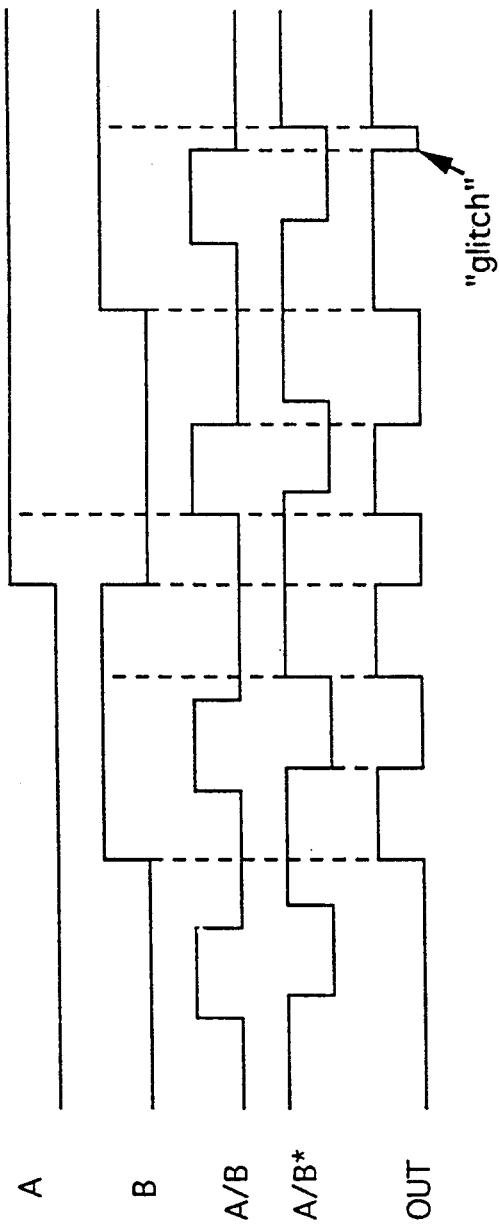
FIG. 2 is a logic diagram of a multiplexer of the present invention.

Referring now to FIG. 2, a timing diagram of the prior art MUX of FIG. 1 can be seen. The timing diagram of FIG. 2 shows the two input signal lines, A and B, as well as the control signal line A/B. The output of inverter 5, denoted A/B*, is also shown in the figure. It is important to note that inverter 5 output A/B* is slightly delayed from the input signal (control signal line A/B) to inverter 5. This delay is due to the time it takes inverter 5 to invert control signal A/B into inverted signal A/B*. Thus, when comparing control signal A/B to inverted signal A/B*, A/B* is not only inverted but also delayed or time-shifted as is shown in the figure. The last signal line shown in the figure is OUT, the output signal line from OR gate 7 which is the output of the prior art MUX.

Unfortunately, the prior art MUX of FIG. 1 causes timing and logic faults as will now be explained with reference to the timing diagram of FIG. 2. In accordance with the logic of the prior art MUX, as was explained above with reference to FIG. 1, when control signal A/B is low (in which case inverted control signal A/B* is high) OUT (the output of the prior art MUX) follows signal line B. Therefore, because inverted signal A/B* is high and signal line B is low at the beginning of the timing diagram of FIG. 2 OUT is also low.

Continuing with the timing diagram of the figure, control signal A/B goes high to thus select signal line A according to the logic of the prior art MUX. However, due to the delay of inverter 5, inverted signal line A/B* does not immediately go low. However, because both signal line A and signal line B are low at this time, OUT remains low.

Continuing with the timing diagram of the figure, control signal A/B again goes low to thus select signal line B according to the logic of the prior art MUX. Again, due to the delay of inverter 5, inverted signal line A/B* does not immediately go high. Again however, because both signal line A and signal B are still low, OUT remains low.

The next event that occurs is that signal line B goes high. With signal line B high and with inverted signal A/B* high, AND gate 3 outputs a high signal which is input to OR gate 7 which takes OUT high. Therefore, OUT outputs a high signal from the prior art MUX.

Continuing with the timing diagram of the figure, control signal A/B again goes high to thus select signal line A according to the logic of the prior art MUX. Because signal line A is still low AND gate 1 outputs a low signal to OR gate 7. Further, because of the delay of inverter 5 the output of AND gate 3 continues tracking the high signal line B. Therefore, control signal line A/B has no immediate effect on the output of OR gate 7. However, after the delay of inverter 5, inverted signal A/B* goes low which causes AND gate 3 to output a low signal which is input to OR gate 7 which (because the input from AND gate 1 is also low) takes OUT low. Therefore, OUT outputs a low signal from the prior art MUX.

Continuing with the timing diagram of the figure, control signal A/B again goes low to thus select signal line B according to the logic of the prior art MUX. AND gate 1 then outputs a low signal to OR gate 7 which, because inverter 5 delays the effect of signal line B, thus has no effect on the already low output of OR gate 7. After the delay of inverter 5, inverted signal A/B* goes high which causes AND gate 3 to output a high signal (because signal line B is high) which is input to OR gate 7 which takes OUT high. Therefore, OUT outputs a high signal from the prior art MUX.

The next event that occurs is that signal line A goes high and signal line B goes low. Because control signal A/B is low and inverted signal A/B* is high, OR gate 7 and OUT will follow signal line B and also go low.

Continuing with the timing diagram of the figure, control signal A/B again goes high to thus select signal line A according to the logic of the prior art MUX. Because signal line A is now high AND gate 1 outputs a high signal to OR gate 7 which takes OUT high. Therefore, OUT outputs a high signal from the prior art MUX.

Continuing with the timing diagram of the figure, control signal A/B again goes low to thus select signal line B according to the logic of the prior art MUX. Because control signal A/B is now low and because signal line B is still low, OR gate 7 sees a low input from both AND gate 1 and AND gate 3 and thus OR gate 7 takes OUT low. Therefore, OUT outputs a low signal from the prior art MUX.

The next event that occurs is that signal line B again goes high. With signal line B high and with inverted signal A/B* high, AND gate 3 outputs a high signal which is input to OR gate 7 which takes OUT high. Therefore, OUT outputs a high signal from the prior art MUX.

Continuing with the timing diagram of the figure, control signal A/B again goes high to thus select signal line A according the logic of the prior art MUX. Because signal line A is still high AND gate 1 outputs a high signal to OR gate 7. However, this does not change the state of OUT (the output from OR gate 7 and hence the prior art MUX) because OUT was already high.

Continuing with the timing diagram of the figure, control signal A/B again goes low to thus select signal line B. Taking control signal A/B low causes AND gate 1 to output a low signal to OR gate 7. As before, inverter 5 delays the inversion of inverted signal A/B* from a low signal to a high signal. Thus AND gate 3, which is still seeing inverted signal A/B* as a low signal, still outputs a low signal to OR gate 7. Therefore, OR gate 7 sees a low signal from both AND gate 1 and AND gate 3 and thus takes OUT low. Therefore, OUT outputs a low signal from the prior art MUX. Of course, after the delay of inverter 5 inverted signal A/B* again goes high and because signal line B is still high AND gate 3 outputs a high signal to OR gate 7 which thus takes OUT high. It is only at that point that OUT outputs a high signal from the prior art MUX.

Unfortunately, the last sequence described is an error condition. The last sequence describes a condition when both signal line A and signal line B are high and where control signal line switches from selecting signal line A to selecting signal line B. Switching a MUX from one high signal (in this case signal line A) to another high signal (in this case signal line B) should not cause any change in output from the MUX (in this case OUT). However, as just explained, OUT went from a high condition to a low condition and then back to a high condition for the duration of the delay caused by inverter 5.

This error is unfortunate not only because an incorrect condition is seen at the output but also because the change in state, with the subsequent return to the proper state, occurs in such a short time-span that a large amount of power is drawn. Such a large power draw, consisting of both voltage and current spikes, causes a large amount of ElectroMagnetic Interference (EMI). And the more rapid the signal line pulses the greater the amount of EMI that is caused. Therefore, this incorrect pulse, or "glitch" as shown in the figure, not only strains the power requirements of the prior art MUX but it also creates large amounts of EMI which is undesirable in modern electronic equipment.

The present invention eliminates the incorrect state changes of the prior art MUX. This is accomplished by ensuring that when both signal line A and signal line B are high and the control signal line switches from selecting signal line A to selecting signal line B the output from MUX of the present invention remains high. Furthermore, the present invention achieves this condition without further delaying any of the signal lines of the present invention MUX as compared to the prior art MUX. Still further, the present invention eliminates the large power draw and EMI caused by the incorrect pulse or glitch of the prior art MUX.

Figure 3:
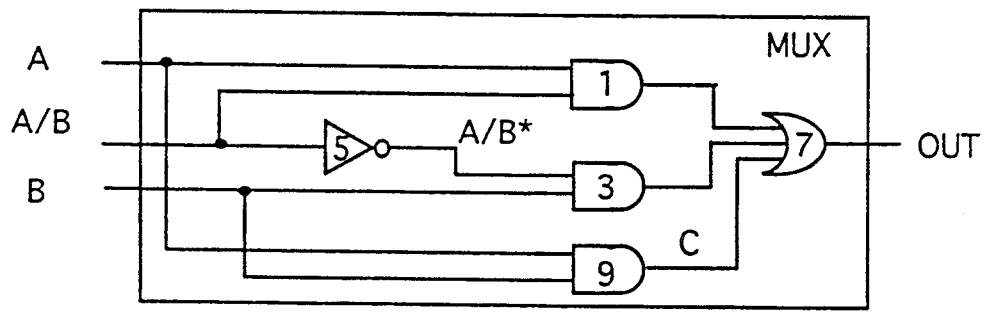
FIG. 3 is a timing diagram of the prior art multiplexer of FIG. 1.

Referring now to FIG. 3, a logic diagram of the Multiplexer (MUX) of the present invention can be seen. The MUX of the present invention has additional logic which ensures that when both signal line A and signal line B are high at least one input to OR gate 7 always remains high regardless of the state of control signal A/B and inverted signal A/B*. In the preferred embodiment of the present invention, this is achieved by the addition of AND gate 9 which receives as inputs both signal line A and signal line B and which outputs C the logical AND of signal line A and signal line B as another input to OR gate 7, as is shown in the figure. AND gate 9, consistent with the normal operation of an AND gate, thus ensures that OR gate 7 always receives at least one high input whenever both signal line A and signal line B are high.

Figure 4:
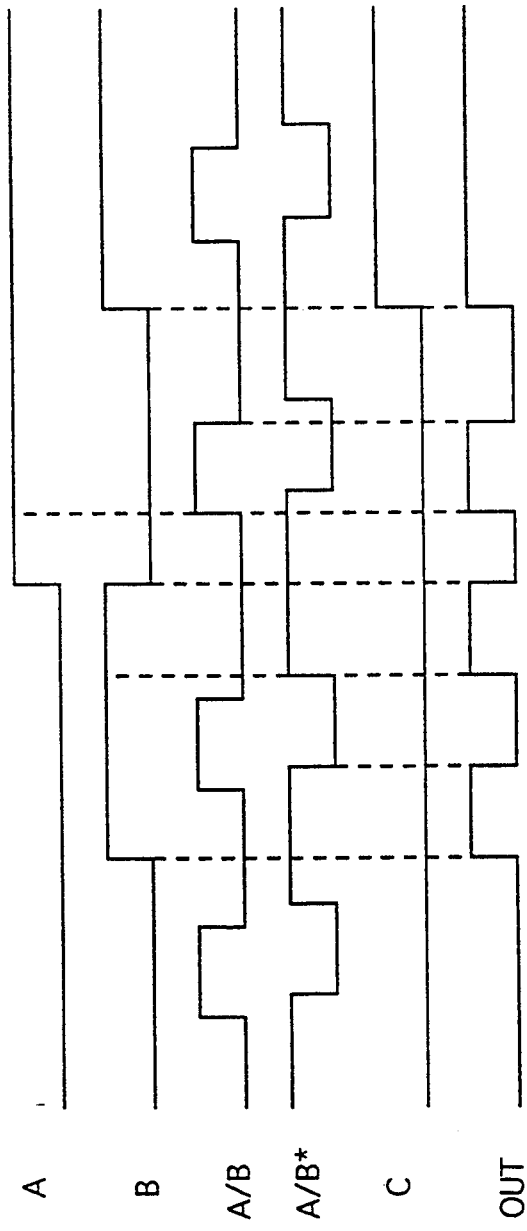
FIG. 4 is a timing diagram of the multiplexer of the present invention.

Referring now to FIG. 4, a timing diagram of the present invention MUX of FIG. 3 with the further addition of signal line C (the output of AND gate 9 which is input to OR gate 7) can be seen. As stated above, and consistent with the normal operation of an AND gate, AND gate 9 only outputs a high signal C when both signal line A and signal line B are high. As such, the output of OR gate 7 is only affected when both signal line A and signal line B are high. Therefore OUT (the output signal line from OR gate 7 which is the output of the MUX) is unchanged in the timing diagram of FIG. 4 (which corresponds to the preferred embodiment of the present invention MUX of FIG. 3) as compared to the timing diagram of FIG. 2 (which corresponds to the prior art MUX of FIG. 1) whenever either signal line A or signal line B is low. As such, the timing diagrams of FIG. 4 and FIG. 2 are identical except when both signal line A and signal line B are high. Therefore, starting at the point in the timing diagram of FIG. 4 where both signal line A and signal line B go high, the glitch elimination of the present invention will now be explained.

Beginning at the point where both signal line A is high and signal line B is high, AND gate 9, consistent with the normal operation of an AND gate, outputs a high signal C to OR gate 7 which thus ensures that OUT is high. Therefore, as explained above whenever both signal line A and signal line B are high, OUT outputs a high signal in the present invention MUX.

Continuing with the timing diagram of the figure, control signal A/B again goes high to thus select signal line A according to the logic of the present invention MUX. Because signal line A is high and because control signal A/B is high AND gate 1 outputs a high signal to OR gate 7 which thus takes OUT high. Of course, because both signal line A and signal line B are high, AND gate 9 was already sending a high signal C to OR gate 7 and thus OUT was already high, as can be seen in the figure.

Continuing with the timing diagram of the figure, control signal A/B again goes low to thus select signal line B. Taking control signal line A/B causes AND gate 1 to output a low signal to OR gate 7. And because inverter 5 causes a delay in taking inverted signal A/B* high, AND gate 3 does not immediately output the high signal B to OR gate 7. In the prior art MUX this would cause the glitch error condition and EMI as was explained above. However, because both signal line A and signal line B remain high, AND gate 9 still outputs a high signal C to OR gate 7 which thus keeps OUT high throughout this period, as can been seen in the timing diagram of the figure.

Then, when inverter 5 inverts low control signal A/B to create inverted high signal A/B*, AND gate 3 outputs a high signal because signal line B is also high. OR gate 7 would thus see high signals from both AND gate 9 and AND gate 3 and would continue to output a high signal on OUT (the output from OR gate 7 and the present invention MUX of FIG. 3).

Note that the preferred embodiment of the present invention selectively switches between one of two input signals. However, based on the teachings herein, it would be apparent to one of ordinary skill in the art to apply the present invention to the use of more than two input signals.

In the foregoing specification, the invention has been described with reference to a specific exemplary embodiment and alternative embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for generating an output signal corresponding to either a first input signal or a second input signal according to a control signal, said output signal generation method comprising:

generating the logical AND of said first input signal and said control signal as a first intermediate signal;

generating the logical AND of said second input signal and the inverse of said control signal as a second intermediate signal;

generating the logical AND of said first input signal and said second input signal as a third intermediate signal; and, generating the logical OR of said first intermediate signal, said second intermediate signal, and said third intermediate signal as said output signal.

2. The output signal generation method of claim 1 wherein said first input signal is a first DRAM address signal.

3. The output signal generation method of claim 2 wherein said second input signal is a second DRAM address signal.

4. An apparatus for inputting a first input signal and a second input signal and outputting an output signal corresponding to either said first input signal or said second input signal according to a control signal, said apparatus comprising:

means for generating the logical AND of said first input signal and said control signal as a first intermediate signal;

means for generating the logical AND of said second input signal and the inverse of said control signal as a second intermediate signal;

means for generating the logical AND of said first input signal and said second input signal as a third intermediate signal; and, means for generating the logical OR of said first intermediate signal, said second intermediate signal, and said third intermediate signal as said output signal of said apparatus.

5. The apparatus of claim 4 wherein said first input signal is a first DRAM address signal.

6. The apparatus of claim 5 wherein said second input signal is a second DRAM address signal.

7. An improved multiplexer for receiving a first input signal and a second input signal and sending an output signal corresponding to either said first input signal or said second input signal according to a control signal, said improved multiplexer comprising:

a first AND gate inputting said first input signal and said control signal and outputting a first intermediate signal;

a second AND gate inputting said second input signal and the inverse of said control signal and outputting a second intermediate signal;

a third AND gate inputting said first input signal and said second input signal and outputting a third intermediate signal; and, an OR gate inputting said first intermediate signal, said second intermediate signal, and said third intermediate signal and outputting said improved multiplexer output signal.

8. The improved multiplexer of claim 7 wherein said first input signal is a first DRAM address signal.

9. The improved multiplexer of claim 8 wherein said second input signal is a second DRAM address signal.

10. The improved multiplexer of claim 9 wherein said inverse control signal is the output of an inverter, said inverter receiving said control signal as an input.

* * * * *